(12) United States Patent
Chu

(10) Patent No.: US 7,560,969 B2
(45) Date of Patent: Jul. 14, 2009

(54) RECEIVER OF HIGH SPEED DIGITAL INTERFACE

(75) Inventor: Yuan-Kai Chu, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/898,157

(22) Filed: Sep. 10, 2007

(65) Prior Publication Data

US 2009/0067545 A1     Mar. 12, 2009

(51) Int. Cl.
*H03L 5/00* (2006.01)
*H03K 5/08* (2006.01)

(52) U.S. Cl. ............... 327/307; 327/52; 327/561; 330/9; 330/252

(58) Field of Classification Search ............ 327/50–54, 327/307, 561–563; 326/63, 68, 80, 81; 330/9, 330/252–253
See application file for complete search history.

(56) References Cited

U.S. PATENT DOCUMENTS

| 5,959,492 A * | 9/1999 | Khoury et al. ............... 327/389 |
| 7,466,193 B2 * | 12/2008 | Kim ............................... 330/9 |
| 2006/0125543 A1 * | 6/2006 | Hsieh et al. .................. 327/307 |

* cited by examiner

*Primary Examiner*—Lincoln Donovan
*Assistant Examiner*—John W Poos
(74) *Attorney, Agent, or Firm*—Rabin & Berdo, P.C.

(57) ABSTRACT

A receiver of a high speed digital interface includes at least one differential amplifier, a pair of resistive elements, a current source and a pair of transistors. The differential amplifier receives a small differential signal at a pair of input terminals and outputs an amplified differential signal. Each of the resistive elements has one end coupled to one of the input terminals of the differential amplifier and the other end receiving a reference voltage. The pair of transistors has drains respectively coupled to the input terminals of the differential amplifier, sources commonly coupled to the current source and gates receiving a differential feedback signal derived from the amplified differential signal.

2 Claims, 4 Drawing Sheets

RECEIVER OF HIGH SPEED DIGITAL INTERFACE

BACKGROUND OF THE INVENTION

1. Field of the Invention

The present invention relates in general to a receiver of a high speed digital interface, and more particularly to a receiver having a limiting amplifier with reduced DC offset and improved impedance matching.

2. Description of the Related Art

In a receiver side of a high speed digital interface, there is a need for the amplification of high frequency low power signals. This is achieved with a dedicated differential amplifier basically consisting of a chain of low gain large bandwidth amplifiers with a parallel feedback loop.

Referring to FIG. 1, a block diagram of a conventional limiting differential amplifier in a receiver side of a high speed digital interface is shown. The differential amplifier 10 includes an input matching circuit 11, an amplification section 12 and a feedback block 13. The amplification section 12 consists of a chain of large bandwidth amplifiers to obtain enough gain in the frequencies of interest. The feedback block 13 in the DC feedback loop is connected in parallel between the inputs and outputs of said amplification section 12. All these circuit components are mounted in a differential manner. The input matching circuit 11 consists of a single resistor for the sake of simplicity. The input matching circuit 11 is mounted between two input terminals 14 and 15 receiving single-ended input signals Vinp and Vinn respectively from a preceding stage. Then corresponding single-ended output signals Voutp and Voutn are available at output terminals 18 and 19 respectively.

Feedback block 13 includes an amplifier 16 and a RC network 17 comprised of blocks 17' for low pass filtering and 17" to perform the summation of the direct input signals Vinp and Vinn and feedback signals Fbn and Fbp at nodes A and B at the inputs of the first amplifier of amplification section 12 as shown in the drawing. The dotting, which is made at nodes A and B, allows the desired reduction of the DC offset by the single-ended feedback signals Fbn and Fbp.

The conventional differential amplifier shown in FIG. 1 only partially reduces the DC offset, because, unfortunately, it amplifies not only the useful input signal but also any DC offset signal, coming from the previous circuits or internally generated at the input terminals of amplifier 10. The amplitude of this DC offset signal can be of the same order of magnitude or even greater than the one of the input signal itself and then can detrimentally saturate the differential output signal with invalid information. In addition, the feedback block 13, which connect the RC network 17 in parallel on the input matching circuit 11, significantly degrades the input impedance matching.

SUMMARY OF THE INVENTION

It is therefore an object of the invention to provide a receiver of a high speed digital interface with a limiting amplifier capable of achieving reduced DC offset and improved impedance matching.

According to a first aspect of the present invention, a receiver of a high speed digital interface including at least one differential amplifier, a pair of resistive elements, a current source and a pair of transistors is provided. The differential amplifier receives a small differential signal at a pair of input terminals and outputs an amplified differential signal. Each of the resistive elements has one end coupled to one of the input terminals of the differential amplifier and the other end receiving a reference voltage. The pair of transistors has drains respectively coupled to the input terminals of the differential amplifier, sources commonly coupled to the current source and gates receiving a differential feedback signal derived from the amplified differential signal.

According to a second aspect of the present invention, a receiver of a high speed digital interface including at least one differential amplifier, a pair of resistive elements, a pair of low-pass filters, a first transistor, a second transistor, a third transistor, a fourth transistor, a fifth transistor, a sixth transistor, a seventh transistor, a eighth transistor and a ninth transistor is provided. The differential amplifier receives a small differential signal at a pair of input terminals and outputs an amplified differential signal. Each of the resistive elements has one end coupled to one of the input terminals of the differential amplifier and the other end receiving a reference voltage. The pair of low-pass filters receives the amplified differential signal and derives a differential feedback signal from the amplified differential signal. The first transistor and the second transistor have drains respectively coupled to the input terminals of the differential amplifier and gates receiving the differential feedback signal. The third transistor has a drain coupled to sources of the first transistor and the second transistor, a source receiving a ground voltage and a gate receiving a bias voltage. The fourth transistor has a source receiving an operational voltage, a drain outputting the reference voltage and a gate coupled to the drain of the fourth transistor. The fifth transistor has a source receiving the operational voltage and a drain coupled to the gate of the fourth transistor. The sixth transistor has a source receiving the operational voltage and a gate coupled to a gate of the fifth transistor and a drain of the sixth transistor. The seventh transistor has a drain coupled to the drain of the fifth transistor and a gate receiving a common mode voltage. The eighth transistor has a drain coupled to the drain of the sixth transistor and a gate receiving the reference voltage. The ninth transistor has a drain coupled to sources of the seventh transistor and the eighth transistor, a source receiving the ground voltage and a gate receiving the bias voltage.

According to a third aspect of the present invention, a receiver of a high speed digital interface including at least one differential amplifier, a pair of resistive elements, a pair of low-pass filters, a first transistor, a second transistor, a third transistor, a fourth transistor, a fifth transistor, a sixth transistor, a seventh transistor, a eighth transistor, a ninth transistor, a tenth transistor, an $11^{th}$ transistor, a $12^{th}$ transistor and a $13^{th}$ transistor is provided. The differential amplifier receives a small differential signal at a pair of input terminals and outputs an amplified differential signal. Each of the resistive elements has one end coupled to one of the input terminals of the differential amplifier and the other end receiving a reference voltage. The pair of low-pass filters receives the amplified differential signal and derives a differential feedback signal from the amplified differential signal. The first transistor and the second transistor have drains respectively coupled to the input terminals of the differential amplifier and gates receiving the differential feedback signal. The third transistor has a drain coupled to sources of the first transistor and the second transistor and a gate receiving a first bias voltage. The fourth transistor has a gate receiving the first bias voltage. The fifth transistor has a drain coupled to a source of the third transistor and a source receiving a ground voltage. The sixth transistor has a drain coupled to a source of the fourth transistor, a source receiving the ground voltage and a gate coupled to a gate of the fifth transistor and a drain of the fourth transistor. The seventh transistor has a drain outputting the reference voltage and a gate receiving a second bias voltage. The eighth transistor has a drain coupled to the drain of the fourth transistor and a gate receiving the second bias voltage. The ninth transistor has a source receiving an operational voltage, a drain coupled to a source of the seventh transistor and a gate receiving a third bias voltage. The tenth transistor has a source receiving the operational voltage, a drain coupled to a source of the eighth transistor and a gate receiving the third bias voltage. The 11$^{th}$ transistor has a drain coupled to the source of the seventh transistor and a gate receiving a common mode voltage. The 12$^{th}$ transistor has a drain coupled to the source of the eighth transistor and a gate receiving the reference voltage. The 13$^{th}$ transistor has a drain coupled to sources of the 11$^{th}$ transistor and the 12$^{th}$ transistor, a source receiving the ground voltage and a gate receiving a fourth bias voltage.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
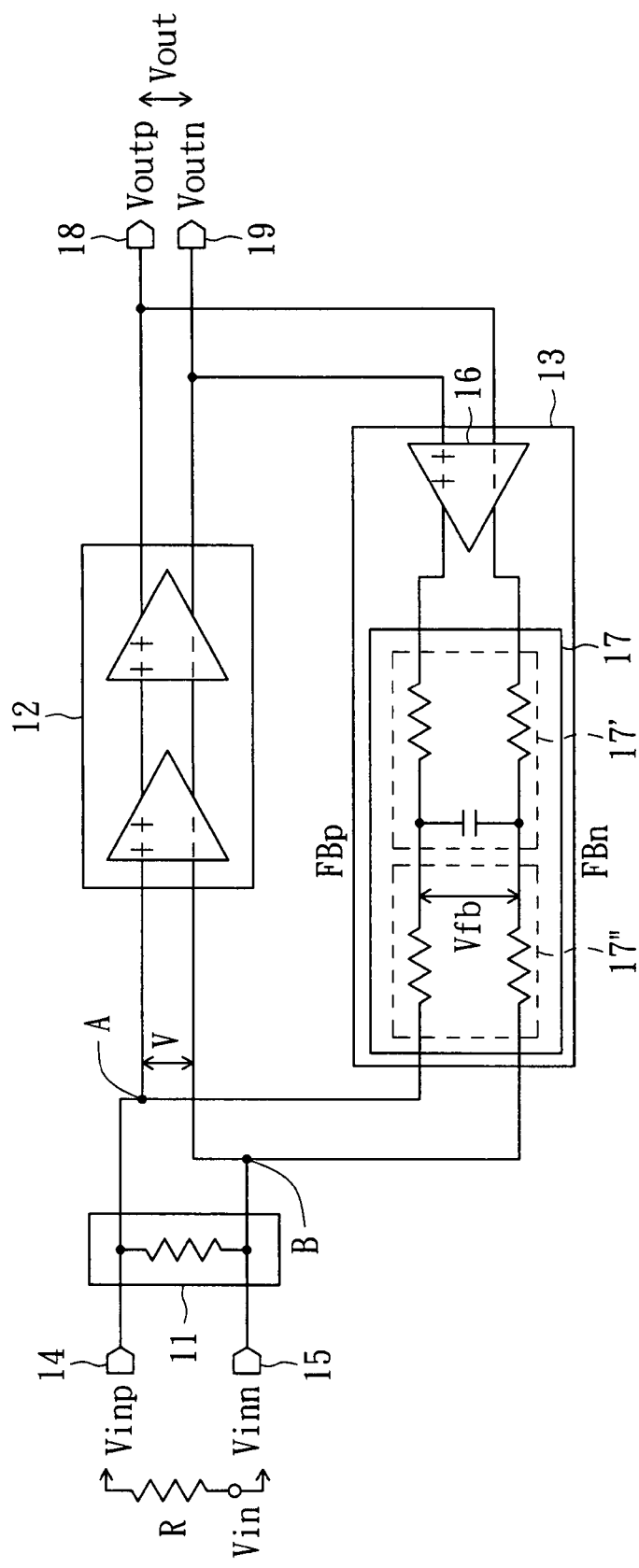
FIG. 1 is a block diagram of a conventional limiting differential amplifier in a receiver side of a high speed digital interface.
Figure 2:
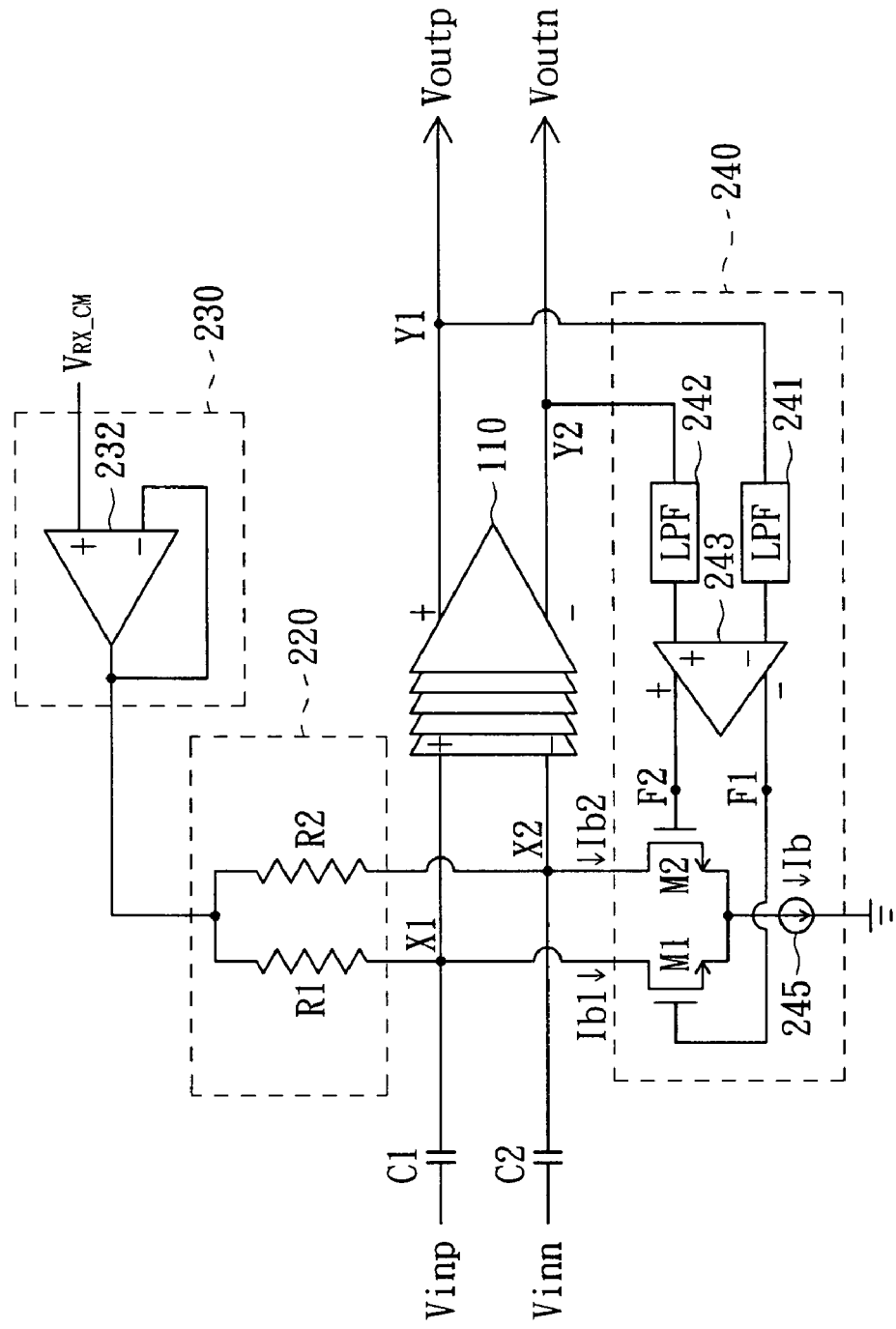
FIG. 2 is a general block diagram showing a receiver of a high speed digital interface according to a preferred embodiment of the invention.

FIG. 2 is a general block diagram showing a receiver 200 of a high speed digital interface according to a preferred embodiment of the invention. The receiver 200 includes at least one differential amplifier 210, a resistive matching circuit 220, an input common mode bias circuit 230 and an offset cancellation circuit 240.

The differential amplifier 210 may be a single differential amplifier or may be composed of multiple stages. The differential amplifier 210 has a first input terminal X1, a second input terminal X2, a first output terminal Y1 and a second output terminal Y2. The first input terminal X1 and the second input terminal X2 are respectively coupled to a first capacitance C1 and a second capacitance C2. The differential amplifier 210 receives a small differential signal (Vinp, Vinn) in an AC-coupled manner, wherein the first input terminal X1 receives a positive input signal Vinp, and the second input terminal X2 receives a negative input signal Vinn. The differential amplifier 210 outputs an amplified differential signal (Voutp, Voutn), wherein the first output terminal Y1 outputs a positive signal Voutp, and the second output terminal Y2 outputs a negative signal Voutn.

The input impedance of the receiver 200 matches with an output impedance of a transmitter (not shown) by the resistive matching circuit 220. The improved impedance matching reduces power loss in the received signal. The resistive matching circuit 220 has a first resistor R1 and a second resistor R2. The first resistor R1 and the second resistor R2 have, without limitation to, the same resistance of R. The resistances of the first resistor R1 and the second resistor R2 are determined such that the input impedance of the receiver 200 matches with the output impedance of the transmitter. The first resistor R1 has a first terminal coupled to the first input terminal X1. The second resistor R2 has a first terminal coupled to the second input terminal X2. Both of the resistors R1 and R2 have second terminals commonly coupled to the input common mode bias circuit 230 at a node S.

The input common mode bias circuit 230 provides a reference voltage at the node S. The input common mode bias circuit 230 has a unit gain buffer 232 substantially composed of an operational amplifier having a positive input terminal receiving a common mode voltage $V_{RX\_CM}$, and a negative input terminal coupled to its output terminal. The input common mode bias circuit 230 provides an input common mode bias voltage ($V_{RX\_CM}$–R×Ib/2) to the input terminals (X1, X2) of the at least one differential amplifier 210 such that the input terminals (X1, X2) of the at least one differential amplifier 210 will not overshoot or undershoot. The common mode voltage $V_{RX\_CM}$ may range between an operation voltage (Vdd) and the ground voltage, and preferably have a value of (Vdd/2).

The offset cancellation circuit 240 cancels an input offset Voffset of the at least one differential amplifier 210 and prevents the at least one differential amplifier 210 from entering the saturation mode. The offset cancellation circuit 240 includes a first low-pass filter 241, a second low-pass filter 242, a buffer 243, a pair of transistors M1 and M2, and a constant current source 245.

The first low-pass filter 241 is coupled to a first output terminal Y1 of the at least one differential amplifier 210, and the second low-pass filter 242 is coupled to a second output terminal Y2 of the amplifier 210. The first low-pass filter 241 and the second low-pass filter 242 filter DC components of the amplified signal outputted from the amplifier 210 to generate a differential feedback signal. The buffer 243 is coupled between the low-pass filters and the gates of the transistors M1 and M2. The pair of the transistors M1 and M2 provides the currents Ib1 and Ib2 respectively flowing through the first resistor R1 and the second resistor R2 such that the DC levels of the input terminals of the at least one differential amplifier 210 are respectively ($V_{RX\_CM}$–Ib1×R) and ($V_{RX\_CM}$–Ib2×R). Thus, the input offset of the at least one differential amplifier 210 is cancelled when Ib1=Ib2.

The gate of the first transistor M1 and the gate of the second transistor M2 are for receiving the differential feedback signal. The drain of the first transistor M1 is coupled to the first input terminal X1. The source of the first transistor M1 is coupled to the constant current source 245. The drain of the second transistor M2 is coupled to the second input terminal X2. The source of the second transistor M2 is coupled to the constant current source 245.

Figure 3:
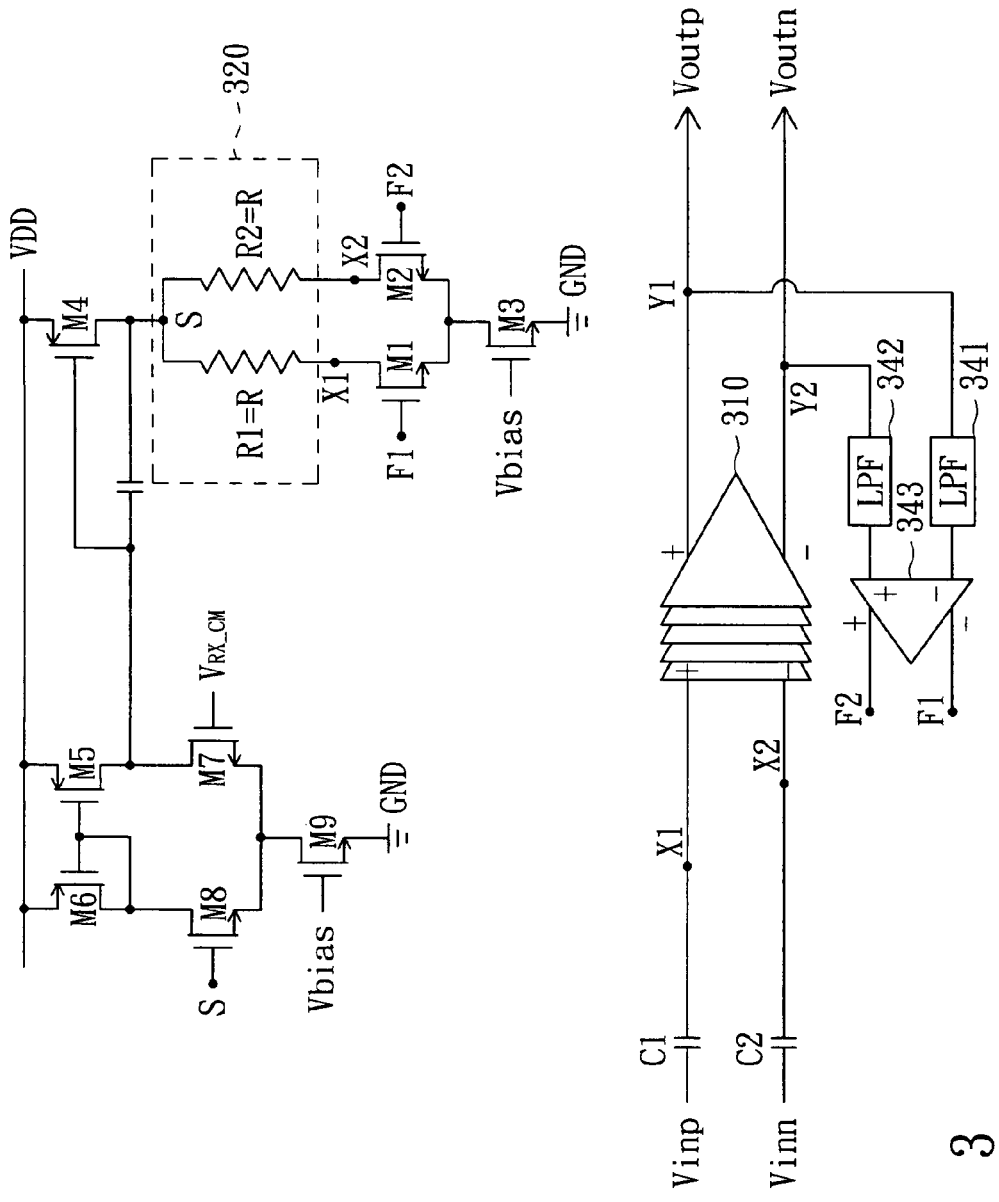
FIG. 3 is a transistor-level circuit diagram showing a detailed implementation of the receiver of FIG. 2.

In addition, in the circuit implementation, the unit gain buffer 232 and the constant current source 245 may be regarded as an OP amplifier circuit to reduce the complexity of the circuit implementation. FIG. 3 is a transistor-level circuit diagram showing a detailed implementation of the receiver of FIG. 2. Referring to FIG. 3, the receiver 300 includes at least one differential amplifier 310, a pair of resistive elements 320 (R1, R2), a pair of low-pass filters 341 and 342, a buffer 343, a first transistor M1, a second transistor M2, a third transistor M3, a fourth transistor M4, a fifth transistor M5, a sixth transistor M6, a seventh transistor M7, a eighth transistor M8 and a ninth transistor M9.

The differential amplifier 310 receives a small differential signal at a pair of input terminals (X1, X2) and outputs an amplified differential signal. Each of the resistive elements (R1, R2) has one end coupled to one of the input terminals of the differential amplifier 310 and the other end receiving a reference voltage (the voltage on node S). The pair of low-pass filters 341 and 342 receives the amplified differential signal and derives a differential feedback signal from the amplified differential signal. The first transistor M1 and the second transistor M2 have drains respectively coupled to the input terminals (X1, X2) of the differential amplifier 310 and gates receiving the differential feedback signal. The buffer 343 is coupled between the gates of the first transistor M1 and the second transistor M2 and the low-pass filters 341 and 342.

The third transistor M3 has a drain coupled to sources of the first transistor M1 and the second transistor M2, a source receiving a ground voltage GND and a gate receiving a bias voltage Vbias. The fourth transistor M4 has a source receiving an operational voltage VDD, a drain outputting the reference voltage and a gate coupled to the drain of the fourth transistor M4. The fifth transistor M5 has a source receiving the operational voltage VDD and a drain coupled to the gate of the fourth transistor M4.

The sixth transistor M6 has a source receiving the operational voltage VDD and a gate coupled to a gate of the fifth transistor M5 and a drain of the sixth transistor M6. The seventh transistor M7 has a drain coupled to the drain of the fifth transistor M5 and a gate receiving a common mode voltage $V_{RX\_CM}$. The eighth transistor M8 has a drain coupled to the drain of the sixth transistor M6 and a gate receiving the reference voltage, that is, coupled to the node S. The ninth transistor M9 has a drain coupled to sources of the seventh transistor M7 and the eighth transistor M8, a source receiving the ground voltage GND and a gate receiving the bias voltage Vbias. The function of the whole of the third transistor M3 to the ninth transistor M9 may be regarded as the same as that of the unit gain buffer 232 and the constant current source 245.

Figure 4:
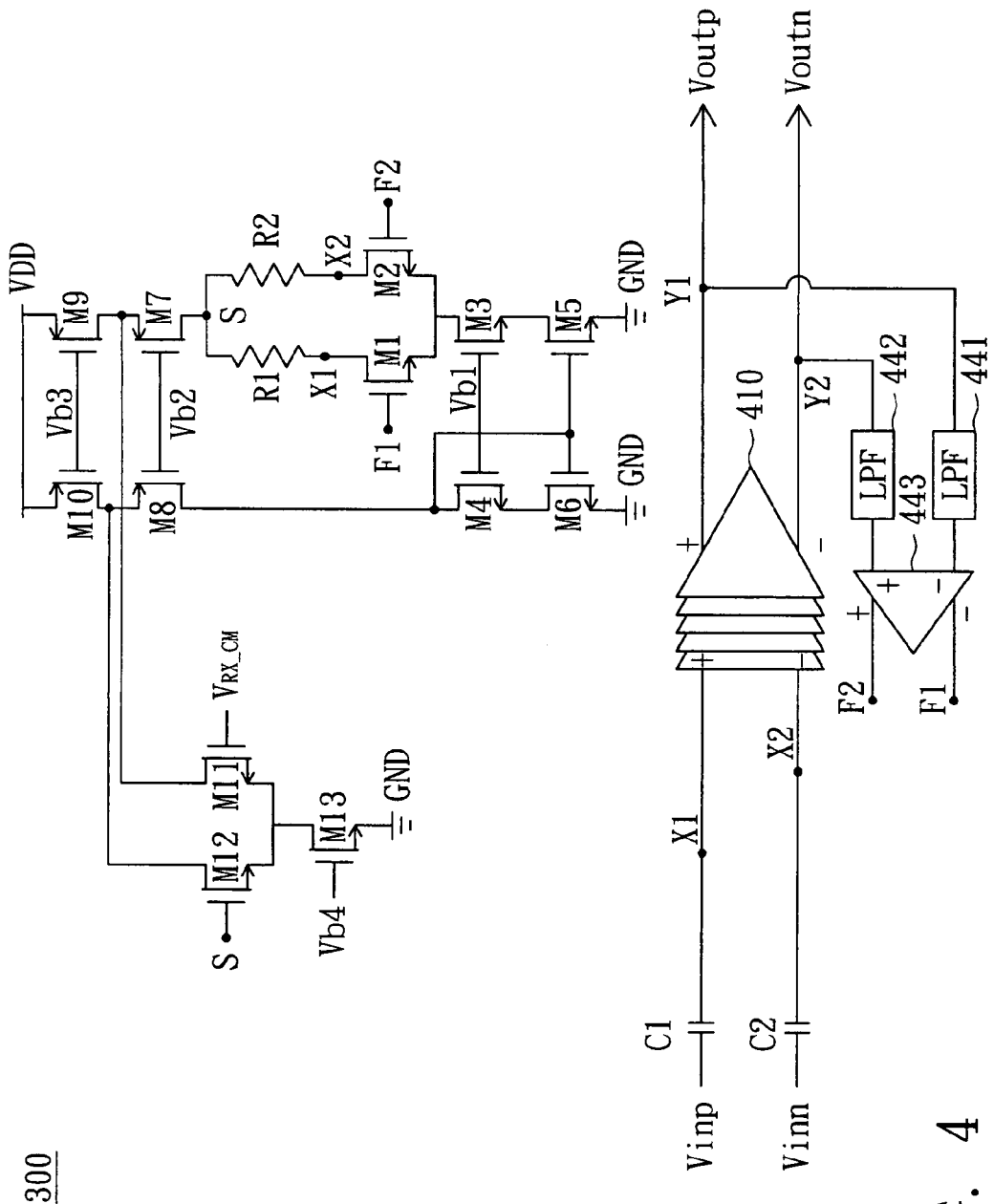
FIG. 4 is a transistor-level circuit diagram showing an alternative implementation of the receiver of FIG. 2.

The operation principle of the receiver 300 is the same as that of the receiver 200, and detailed descriptions thereof will be omitted. In addition, the receiver is not restricted to the above-mentioned two-stage receiver and may also be implemented by any other form of receiver, such as a cascaded receiver. FIG. 4 is a transistor-level circuit diagram showing an alternative implementation of the receiver of FIG. 2. The receiver 400 includes at least one differential amplifier 410, a pair of resistive elements R1 and R2, a pair of low-pass filters 441 and 442, a buffer 443, a first transistor M1, a second transistor M2, a third transistor M3, a fourth transistor M4, a fifth transistor M5, a sixth transistor M6, a seventh transistor M7, a eighth transistor M8, a ninth transistor M9, a tenth transistor M10, an $11^{th}$ transistor M11, a $12^{th}$ transistor M12 and a $13^{th}$ transistor M13.

The differential amplifier 410 receives a small differential signal at a pair of input terminals (X1, X2) and outputs an amplified differential signal. Each of the resistive elements (R1, R2) has one end coupled to one of the input terminals of the differential amplifier 410 and the other end receiving a reference voltage (the voltage on node S). The pair of low-pass filters 441 and 442 receives the amplified differential signal and derives a differential feedback signal from the amplified differential signal. The first transistor M1 and the second transistor M2 have drains respectively coupled to the input terminals (X1, X2) of the differential amplifier 410 and gates receiving the differential feedback signal. The buffer 443 is coupled between the gates of the first transistor M1 and the second transistor M2 and the low-pass filters 441 and 442.

The third transistor M3 has a drain coupled to sources of the first transistor M1 and the second transistor M2 and a gate receiving a first bias voltage Vb1. The fourth transistor M4 has a gate receiving the first bias voltage Vb1. The fifth transistor M5 has a drain coupled to a source of the third transistor M3 and a source receiving a ground voltage GND. The sixth transistor M6 has a drain coupled to a source of the fourth transistor M4, a source receiving the ground voltage GND and a gate coupled to a gate of the fifth transistor M5 and a drain of the fourth transistor M4.

The seventh transistor M7 has a drain outputting the reference voltage and a gate receiving a second bias voltage Vb2. The eighth transistor M8 has a drain coupled to the drain of the fourth transistor M4 and a gate receiving the second bias voltage Vb2. The ninth transistor M9 has a source receiving an operational voltage VDD, a drain coupled to a source of the seventh transistor M7 and a gate receiving a third bias voltage Vb3. The tenth transistor M10 has a source receiving the operational voltage VDD, a drain coupled to a source of the eighth transistor M8 and a gate receiving the third bias voltage VB3.

The $11^{th}$ transistor M11 has a drain coupled to the source of the seventh transistor M7 and a gate receiving a common mode voltage $V_{RX\_CM}$. The $12^{th}$ transistor M12 has a drain coupled to the source of the eighth transistor M8 and a gate receiving the reference voltage, that is, coupled to the node S. The $13^{th}$ transistor M13 has a drain coupled to sources of the $11^{th}$ transistor M11 and the $12^{th}$ transistor M12, a source receiving the ground voltage GND and a gate receiving a fourth bias voltage Vb4. The function of the whole of the third transistor M3 to the $13^{th}$ transistor M13 may be regarded as the same as that of the unit gain buffer 232 and the constant current source 245. The operation principle of the receiver 400 is the same as that of the receiver 200, and detailed descriptions thereof will be omitted.

The receiver of the high speed digital interface according to the embodiment of the invention utilize the simple circuits to enable the differential amplifiers to have the input impedance matching property, the input common mode bias property and the input offset cancellation property. The invention utilizes the impedance matching property to completely feed in the small differential signal without power loss. Meanwhile, the input common mode bias property is utilized to prevent input terminals of the receiver from overshoot or undershoot. In addition, it is possible to prevent the differential amplifier from entering the saturation mode. Besides, the receiver according to the embodiment of the invention has the simple circuit, which may be implemented easily, to reduce the cost.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A receiver of a high speed digital interface, comprising:
    at least one differential amplifier for receiving a small differential signal at a pair of input terminals and outputting an amplified differential signal;
    a pair of resistive elements, each of the resistive elements having one end coupled to one of the input terminals of the differential amplifier and the other end receiving a reference voltage;
    a pair of low-pass filters for receiving the amplified differential signal and deriving a differential feedback signal from the amplified differential signal;

a first transistor and a second transistor having drains respectively coupled to the input terminals of the differential amplifier and gates receiving the differential feedback signal;

a third transistor having a drain coupled to sources of the first transistor and the second transistor, a source receiving a ground voltage and a gate receiving a bias voltage;

a fourth transistor having a source receiving an operational voltage, a drain outputting the reference voltage and a gate coupled to the drain of the fourth transistor;

a fifth transistor having a source receiving the operational voltage and a drain coupled to the gate of the fourth transistor;

a sixth transistor having a source receiving the operational voltage and a gate coupled to a gate of the fifth transistor and a drain of the sixth transistor;

a seventh transistor having a drain coupled to the drain of the fifth transistor and a gate receiving a common mode voltage;

a eighth transistor having a drain coupled to the drain of the sixth transistor and a gate receiving the reference voltage; and a ninth transistor having a drain coupled to sources of the seventh transistor and the eighth transistor, a source receiving the ground voltage and a gate receiving the bias voltage.

2. The receiver according to claim 1, further comprising a buffer coupled between the gates of the first transistor and the second transistor and the low-pass filters.

* * * * *